(12) United States Patent
Tien et al.

(10) Patent No.: US 11,569,127 B2
(45) Date of Patent: Jan. 31, 2023

(54) DOUBLE PATTERNING APPROACH BY DIRECT METAL ETCH

(71) Applicant: Taiwan Semiconductor Manufacturing Company Limited, Hsinchu (TW)

(72) Inventors: Hsi-Wen Tien, Xinfeng Township (TW); Wei-Hao Liao, Taichung (TW); Yu-Teng Dai, New Taipei (TW); Hsin-Chieh Yao, Hsinchu (TW); Chih-Wei Lu, Hsinchu (TW); Chung-Ju Lee, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 153 days.

(21) Appl. No.: 17/192,573

(22) Filed: Mar. 4, 2021

(65) Prior Publication Data

US 2022/0285214 A1 Sep. 8, 2022

(51) Int. Cl.
*H01L 21/768* (2006.01)
*H01L 21/3213* (2006.01)

(52) U.S. Cl.
CPC .. *H01L 21/76877* (2013.01); *H01L 21/32136* (2013.01); *H01L 21/32139* (2013.01); *H01L 21/7684* (2013.01); *H01L 21/76834* (2013.01); *H01L 21/76885* (2013.01)

(58) Field of Classification Search
CPC ......... H01L 21/76877; H01L 21/32136; H01L 21/32139; H01L 21/76834; H01L 21/7684; H01L 21/76885; H01L 23/5283; H01L 21/76807; H01L 21/32131; H01L 21/76804; H01L 21/76831
See application file for complete search history.

(56) References Cited

U.S. PATENT DOCUMENTS

| | | | |
|---|---|---|---|
| 2020/0152473 A1* | 5/2020 | Tapily | H01L 21/02164 |
| 2020/0303254 A1* | 9/2020 | Parikh | H01L 21/76883 |
| 2021/0050413 A1* | 2/2021 | Kuo | H01L 21/76885 |

* cited by examiner

*Primary Examiner* — Karen Kusumakar
(74) *Attorney, Agent, or Firm* — Foley & Lardner LLP

(57) ABSTRACT

In one embodiment, a method of forming metal interconnects uses a direct metal etch approach to form and fill the metal gap. The method may include directly etching a metal layer to form metal patterns. The metal patterns may be spaced apart from one another by recesses. A dielectric spacer may be formed extending along the sidewalls of each of the recesses. The recesses may be filled with a conductive material to form a second set of metal patterns. By directly etching the metal film, the technique allows for reduced line width roughness. The disclosed structure may have the advantages of increased reliability, better RC performance and reduced parasitic capacitance.

20 Claims, 17 Drawing Sheets

DOUBLE PATTERNING APPROACH BY DIRECT METAL ETCH

BACKGROUND

The present disclosure generally relates to semiconductor devices, particularly to interconnect structures and methods for their fabrication.

Semiconductor devices are used in a variety of electronic applications, such as personal computers, cell phones, digital cameras and other electronic equipment. As technology has progressed, the demand for smaller semiconductor devices with improved performance has increased. As feature densities increase, the widths of the conductive lines and the spacing between the conductive lines of back end of line (BEOL) multi-layer interconnect structures also need to scale smaller.

Multi-layer metal interconnects are often formed using damascene processes. Damascene processes are typically either single or dual damascene, which includes forming openings by patterning and etching metal trenches and vias and filling the openings with metal. However, as critical dimension and pitch continue to scale down, there are some challenges in forming and filling the metal trench.

To accommodate the smaller scale of the back end of line, there is a need for an improved metal interconnect and a method of forming thereof.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
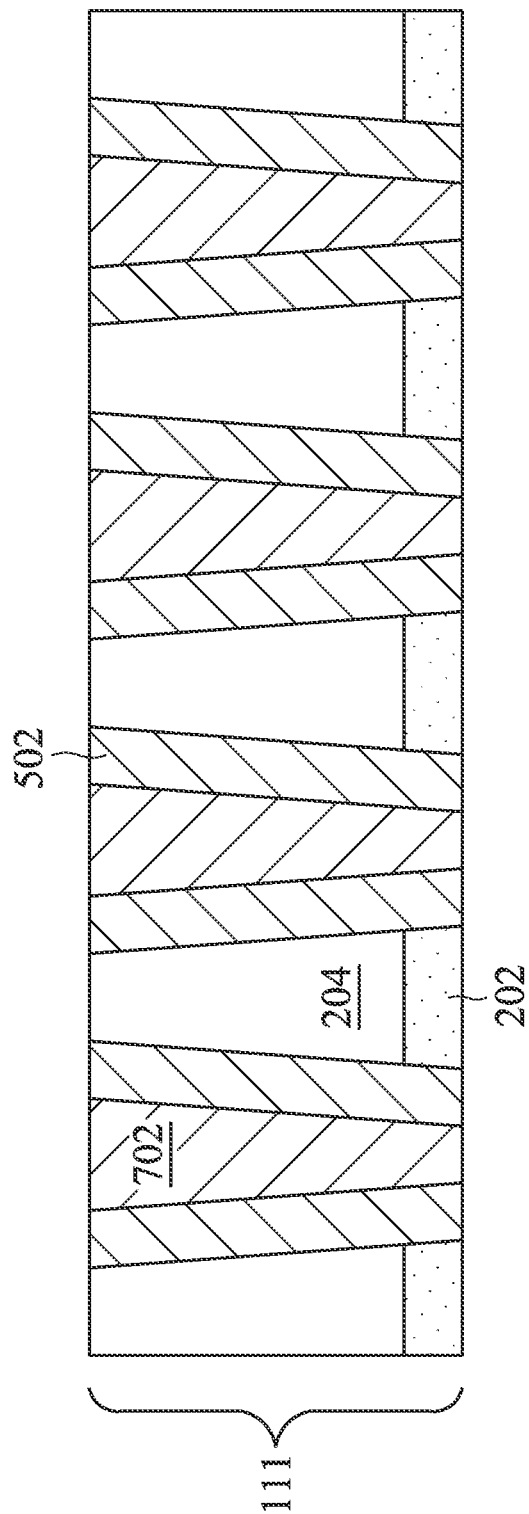
FIG. 1 illustrates a cross-sectional view of a portion of an example semiconductor device 111, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As metal interconnects shrink, the smaller pitch and critical dimension is prone to form degradation and line width roughness (LWR), line edge roughness (LER) or line wiggle. This can be an effect of etching into a low-k film due to the poor mechanical hardness of the film. Additional line wiggle can occur during the metal film gap fill due to the low mechanical hardness of the low-k film. Coupled with the small critical dimension, this line wiggle can cause shorts and cross talk in the metal lines.

The current disclosure is directed to a structure and method of forming the metal interconnects which may lead to a decrease in line wiggle. The process may be a self-aligned processing method involving a direct metal etch approach to form and fill the metal gap. The metal film has a higher mechanical hardness when compared to a low-k film which may result in low line width roughness or line edge roughness. Additional advantages of the disclosed process and structure may include a larger critical dimension. Additionally, the disclosed process may diminish line width roughness or line edge roughness through the metal film gap fill. The disclosed structure may have the advantages of increased reliability, better RC performance and reduced parasitic capacitance by decreasing shorting between the metal lines.

For example, the present disclosure provides a novel structure and method for forming metal interconnects by direct metal etch. The method may include, for instance, forming a metal line by depositing one or more metal layers, etching the metal layer, forming a spacer, and depositing an additional metal layer. The resulting structure may include a conductive region formed by one or more metal layers separated from an additional conductive region by the nonconductive spacer.

FIG. 1 is a cross-sectional view of an example structure in accordance with some embodiments. A first conductive feature may contain a first conductive layer 204. The first conductive layer 204 may be a first metal layer 204. Optionally, the first conductive feature may contain a second conductive layer 202 laterally disposed under the first conductive layer 204. The second conductive layer 202 may be a second metal layer 202. The first conductive feature may be separated from a second conductive feature 702 by a spacer 502. The first conductive feature and second conductive feature 702 may form the (n) level metal line.

In some embodiments, the first conductive layer 204, second conductive layer 202, and second conductive feature 702 may each individually include a material selected from the group consisting of Ta, TaN, TiN, Al, Cu, Co, Ru, Mo, and W. The thickness of the first conductive layer 204 and second conductive layer 202 may be between about 5 nm and about 300 nm. The thickness of the first conductive feature may be tapered at the top. In some embodiments the bottom of the first conductive layer 204 may be larger than the top of the second conductive layer 202. The first conductive feature may have a profile angle between 50 degrees (d) and 90 d off of the horizontal plane of the bottom of the first conductive feature.

In some embodiments, the spacer 502 may include a material selected from the group consisting of AlO, AlN, AlON, ZrO, TiO, TiSiO, ZrTiO, HfO, $SiO_2$, SiOC, SiC, SiCN, SiOCN, SiN, WOx, WN, WC, and WCN or any combination thereof. The spacer 502 may be a dielectric. The spacer 502 may be a low-k or ultra-low-k dielectric. In some embodiments, the spacer may be between about 10 angstroms and about 1000 angstroms. In some embodiments, the critical dimension of the spacer can be at or between about 5 nanometers (nm) and about 270 nm.

The spacer 502 may remain along the side wall of the first conductive layer 204 and the second conductive layer 202. The resulting spacer 502 may be conformal along its height. The resulting spacer 502 may be thicker at the top than at the bottom. The spacer 502 may be angled along the side of the first conductive layer 204 and second conductive layer 202. The profile angle of the spacer 502 may be between 50 degrees (d) and 90 d off of the horizontal plane of the bottom of spacer 502.

In some embodiments, the first conductive feature forming a portion of the (n) level metal line is connected by a conductive via to a third conductive feature forming the (n−1) level metal line. In some embodiments, the second conductive feature forming a portion of the (n) level metal line is connected by a conductive via to a third conductive feature forming the (n−1) level metal line.

Figure 2:
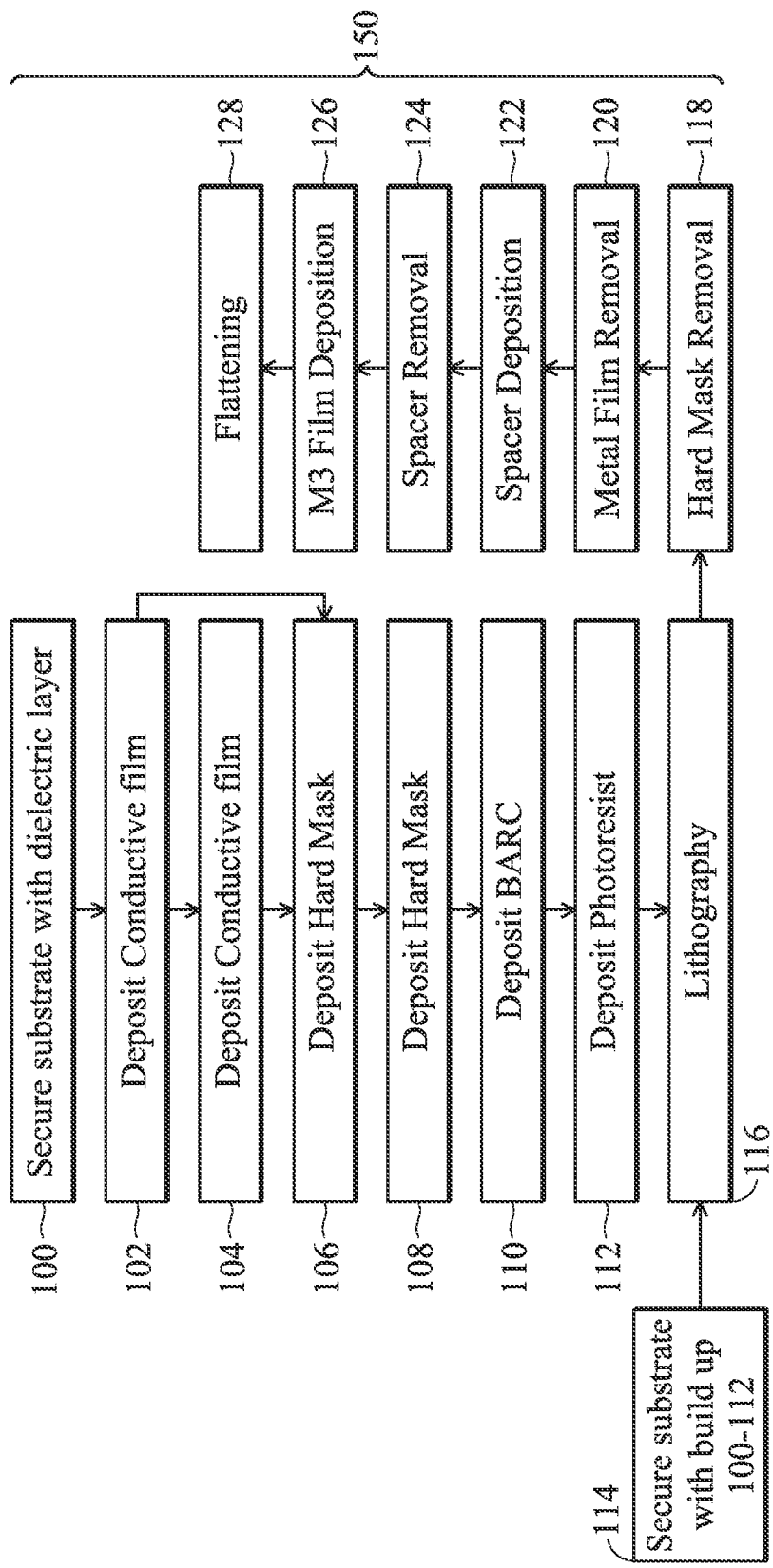
FIG. 2 illustrates a method of fabricating a metal line structure by a double patterning approach by direct metal etch, in accordance with some embodiments.

FIG. 2 is a flowchart illustrating a method 150 for fabricating a semiconductor device 111 according to various aspects of the present disclosure. FIGS. 3, 4, 5, 6, 7, 8, 9, 10, 11, 12, 13, 14, 15, and 16 show schematic cross-sectional views of the semiconductor device 111, respectively, at various stages of fabrication, according to an embodiment of the method 150 of FIG. 2.

Figure 3:
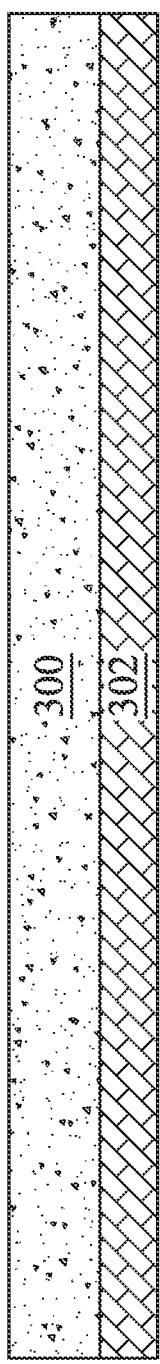
FIGS. 3, 4, 5, 6, 7, 8, 9, 10, 11, 12, 13, 14, 15, and 16 illustrate cross-sectional views of an example semiconductor device 111 during various fabrication stages made by the method of FIG. 2, in accordance with some embodiments.

Referring to FIGS. 2 and 3, the method 150 proceeds to step 100 in which a semiconductor substrate 302 is secured. The semiconductor substrate 302 may have a device structure deposited upon it. The semiconductor substrate 302 may have an interlayer dielectric stack deposited above the device structure. The semiconductor substrate 302 is a substrate as employed in a semiconductor integrated circuit fabrication, and integrated circuits may have been or may be formed therein and/or thereupon. The term "semiconductor substrate" as used herein refers to as any construction comprising semiconductor material, for example, a silicon substrate with or without an epitaxial layer, a silicon-on-insulator substrate containing a buried insulator layer, or a substrate with a silicon germanium layer. The term "integrated circuits" as used herein refers to electronic circuits having multiple individual circuit elements, such as transistors, diodes, resistors, capacitors, inductors, and other active and passive semiconductor devices.

The dielectric layer 300 may be a single layer or a multi-layered structure. In some embodiments, the dielectric layer 300 thickness varies with the applied technology, for example a thickness of about 1000 angstroms to about 30000 angstroms. In some embodiments, the dielectric layer 300 is silicon oxide, carbon-doped silicon oxide, a comparatively low dielectric constant (k value) dielectric material with a k value less than about 4.0, or combinations thereof. In some embodiments, the dielectric layer 300 is formed of a material, including low-k dielectric material, extreme low-k dielectric material, porous low-k dielectric material, and combinations thereof. The term "low-k" is intended to define a dielectric constant of a dielectric material of 3.0 or less. The term "extreme low-k (ELK)" means a dielectric constant of 2.5 or less, and preferably between 1.9 and 2.5. The term "porous low-k" refers to a dielectric constant of a dielectric material of 2.0 or less, and preferably 1.5 or less. A wide variety of low-k materials may be employed in accordance with embodiments, for example, spin-on inorganic dielectrics, spin-on organic dielectrics, porous dielectric materials, organic polymer, organic silica glass, FSG (SiOF series material), HSQ (hydrogen silsesquioxane) series material, MSQ (methyl silsesquioxane) series material, or porous organic series material. In embodiments, the dielectric layer 300 is a nitrogen-containing layer, a carbon-containing layer, or a carbon-containing and nitrogen-containing layer. In one embodiment, the dielectric layer 300 is a silicon-containing and nitrogen-containing dielectric layer.

Figure 4:
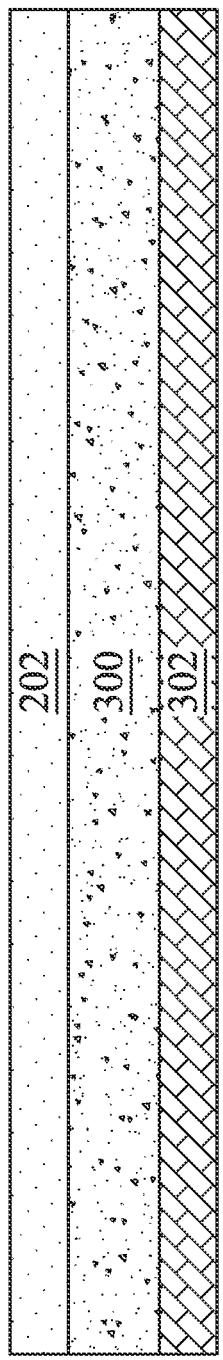

Referring to FIGS. 2 and 4, the method 150 proceeds to step 102 in which a conductive layer 202 is deposited. The conductive layer 202 may be a metal layer 202. In some embodiments, the conductive layer 202 may also include a selective barrier. In some embodiments, the conductive layer 202 may include a conductive material selected from the group consisting of tantalum (Ta), tantalum nitride (TaN), titanium (Ti), titanium nitride (TiN), aluminum (Al), copper (Cu), cobalt (Co), ruthenium (Ru), molybdenum (Mo), tungsten (W), and combinations thereof. The thickness of the conductive layer 202 may be between about 10 angstroms and about 1000 angstroms. The thickness of the conductive layer 202 may be between about 5 nanometers (nm) and about 300 nm.

In some embodiments, the conductive material of the conductive layer 202 is deposited by an electro-chemical plating (ECP) process, physical vapor deposition (PVD), chemical vapor deposition (CVD), plasma enhanced CVD (PECVD), low pressure CVD (LPCVD), atomic layer deposition (ALD), or other well-known deposition techniques. In some embodiments, the conductive material is deposited using a spin-on technique. In some embodiments, deposition may take place at or between about 150° C. and about 400° C. In some embodiments, deposition may occur until the thickness of the conductive layer 202 is at or between about 10 angstroms and about 1000 angstroms.

Figure 5:
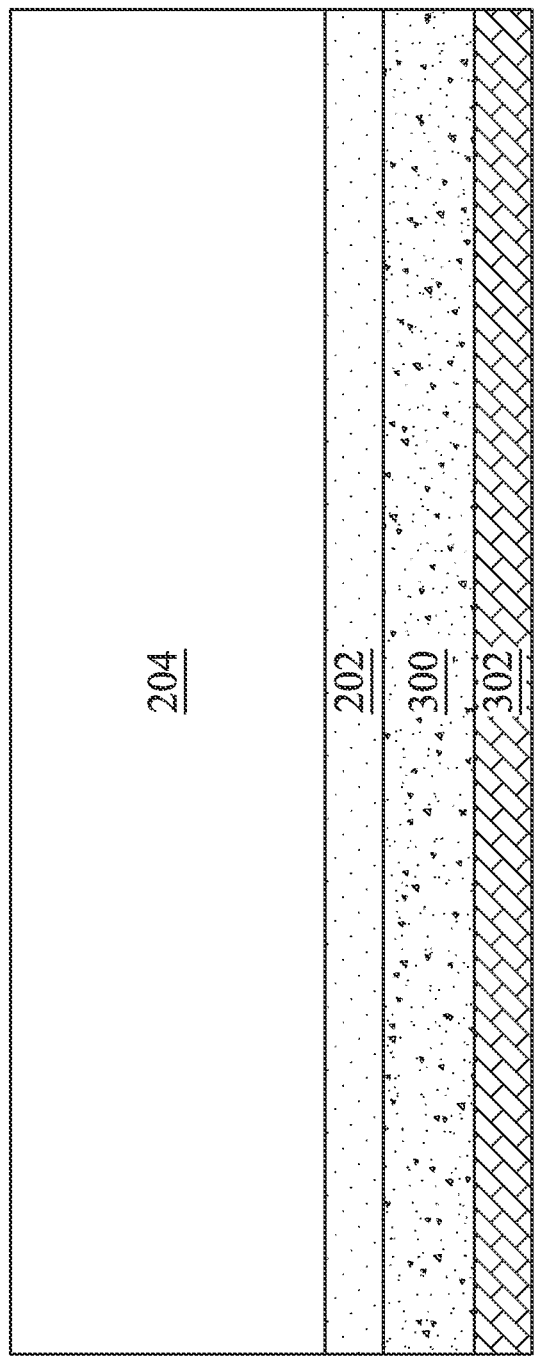

Referring to FIGS. 2 and 5, the method 150 proceeds to step 104 in which a conductive film layer 204 is deposited. Layers 302 and 300 are not shown in the following figures for purposes of simplicity. The conductive film layer 204 may be a metal layer 204. In some embodiments, conductive layer 204 may also include a selective barrier. In some embodiments, the conductive layer 204 may include a conductive material selected from the group consisting of tantalum (Ta), tantalum nitride (TaN), titanium (Ti), titanium nitride (TiN), aluminum (Al), copper (Cu), cobalt (Co), ruthenium (Ru), molybdenum (Mo), and tungsten (W). The thickness of the metal layer 204 may be between about 10 angstroms and about 1000 angstroms. The thickness of the metal layer 204 may be between about 5 nanometers (nm) and about 300 nm.

In some embodiments, the conductive material is deposited by an electro-chemical plating (ECP) process, physical vapor deposition (PVD), chemical vapor deposition (CVD), plasma enhanced CVD (PECVD), low pressure CVD (LPCVD), atomic layer deposition (ALD), or other well-known deposition techniques. In some embodiments, deposition may take place at or between about 150° C. and about 400° C. In some embodiments, deposition may occur until the thickness of the layer is at or between about 10 angstroms and about 1000 angstroms.

Figure 6:
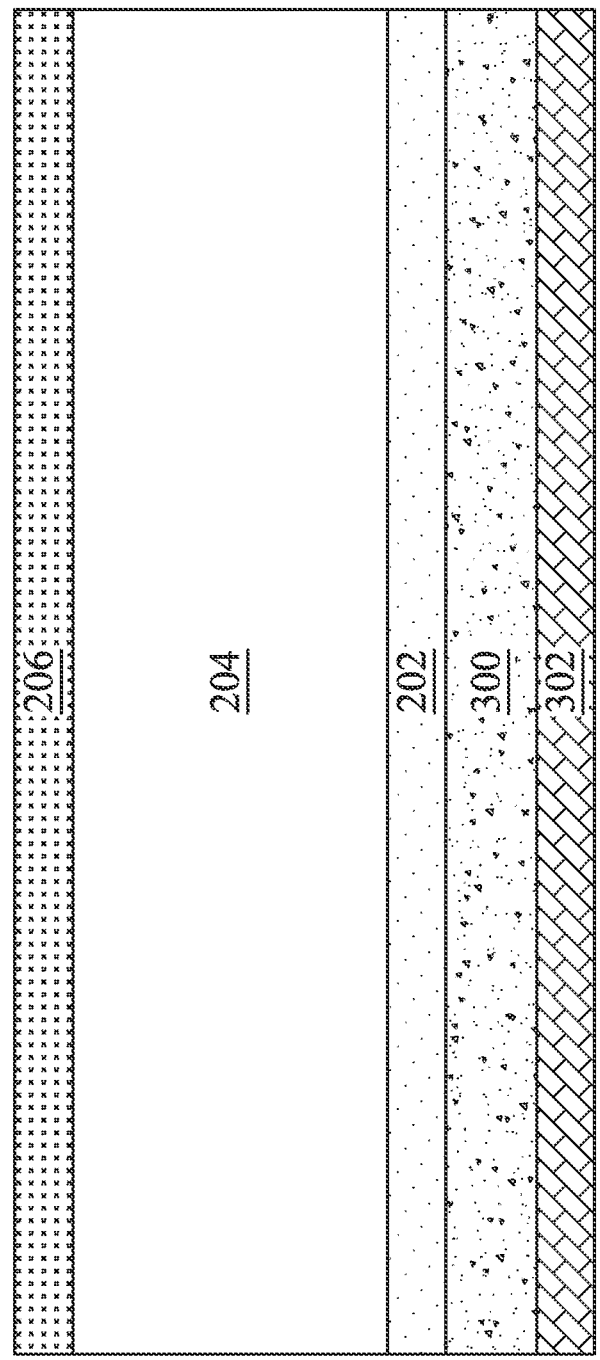

Referring to FIGS. 2 and 6, the method 150 proceeds to step 106 in which an etch stop layer (ESL) 206 is deposited. In some embodiments, the ESL 206 may include a material selected from the group consisting of tantalum (Ta), tantalum nitride (TaN), titanium nitride (TiN), zirconium oxide (ZrO), titanium silicon oxide (TiSiO), zirconium titanium oxide (ZrTiO), hafnium oxide (HfO), silicon carbide (SiC), silicon oxycarbide (SiOC), silicon nitride (SiN), silicon carbonitride (SiCN), silicon oxynitride (SiON), silicon oxycarbonitride (SiOCN), tungsten oxide (WOx), tungsten nitride (WN), tungsten carbide (WC), tungsten carbon nitride (WCN), and tungsten (W). The thickness of the ESL 206 may be between about 10 angstroms and about 1000 angstroms.

In some embodiments, the ESL 206 is deposited by physical vapor deposition (PVD), chemical vapor deposition (CVD), plasma enhanced chemical vapor deposition (PECVD), low pressure chemical vapor deposition (LPCVD), atomic layer deposition (ALD), or other well-known deposition techniques. In some embodiments, the ESL 206 is deposited using a spin-on technique. In some embodiments, deposition may take place at or between about 150° C. and about 400° C. In some embodiments, deposition may occur until the thickness of the layer is at or between about 10 angstroms and about 1000 angstroms.

Figure 7:
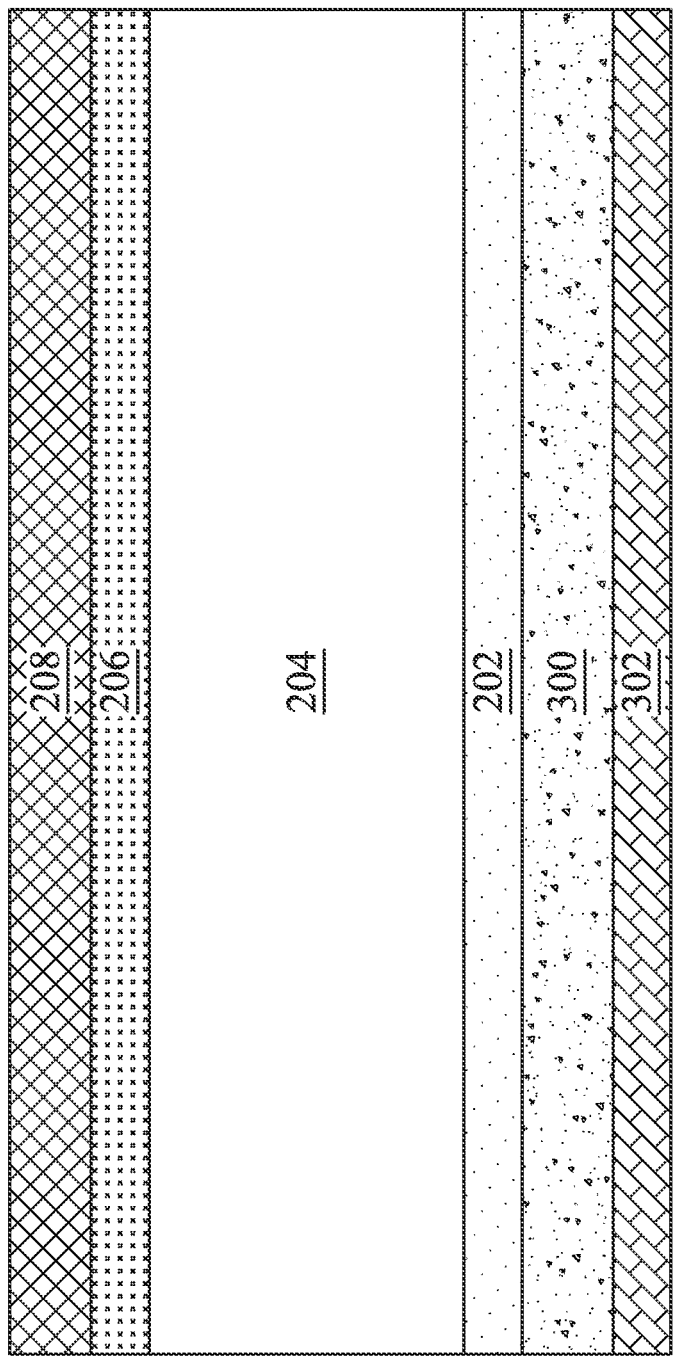

Referring to FIGS. 2 and 7, the method 150 proceeds to step 108 in which a hardmask layer 208 is deposited. The method may include depositing the hardmask layer 208 directly above the ESL 206. In some embodiments, the hardmask layer 208 may include a material selected from the group consisting of (Ta), tantalum nitride (TaN), titanium (Ti), titanium nitride (TiN), zirconium oxide (ZrO), titanium silicon oxide (TiSiO), zirconium titanium oxide (ZrTiO), hafnium oxide (HfO), silicon carbide (SiC), silicon oxycarbide (SiOC), silicon nitride (SiN), silicon carbonitride (SiCN), silicon oxynitride SiON, silicon oxycarbonitride SiOCN, tungsten oxide (WOx), tungsten nitride (WN), tungsten carbide (WC), tungsten carboxynitride (WCN), and tungsten (W). The thickness of the hardmask layer 208 may be between about 10 angstroms and about and 1000 angstroms.

In some embodiments, the hardmask layer 208 is deposited by physical vapor deposition (PVD), chemical vapor deposition (CVD), plasma enhanced CVD (PECVD), low pressure CVD (LPCVD), atomic layer deposition (ALD) or other well-known deposition techniques. In some embodiments, deposition may take place at or between about 150° C. and about 400° C. In some embodiments, deposition may occur until the thickness of the layer is at or between about 10 angstroms and about 1000 angstroms.

Figure 8:
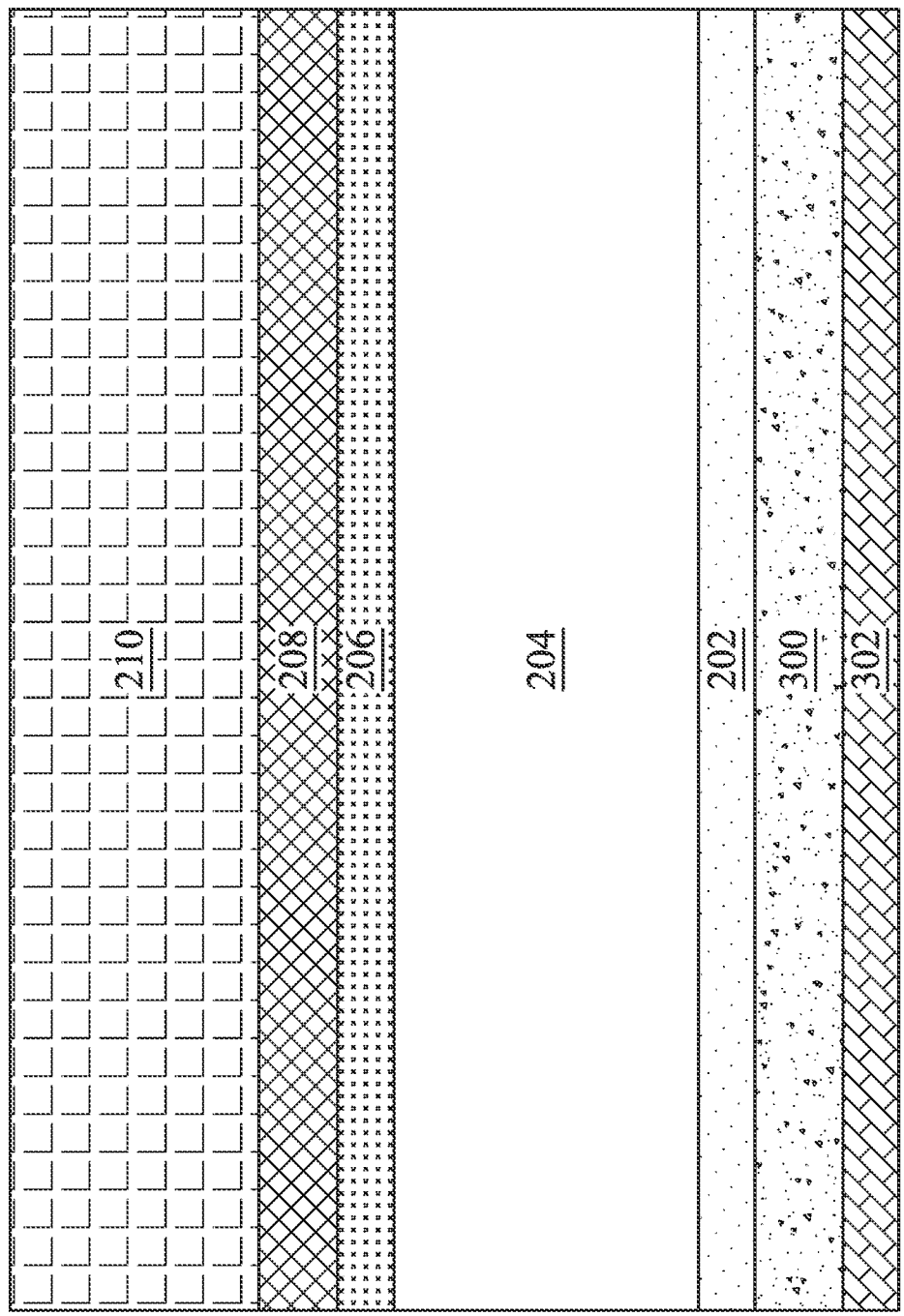

Referring to FIGS. 2 and 8, the method 150 proceeds to step 110 in which a bottom antireflective coating (BARC) layer 210 is deposited. The BARC layer 210 may be an organic compound. In some embodiments, the BARC layer 210 is deposited by physical vapor deposition (PVD), chemical vapor deposition (CVD), plasma enhanced CVD (PECVD), low pressure CVD (LPCVD), atomic layer deposition (ALD) or other well-known deposition techniques. In some embodiments, the BARC layer 210 is deposited using a spin-on technique.

Figure 9:
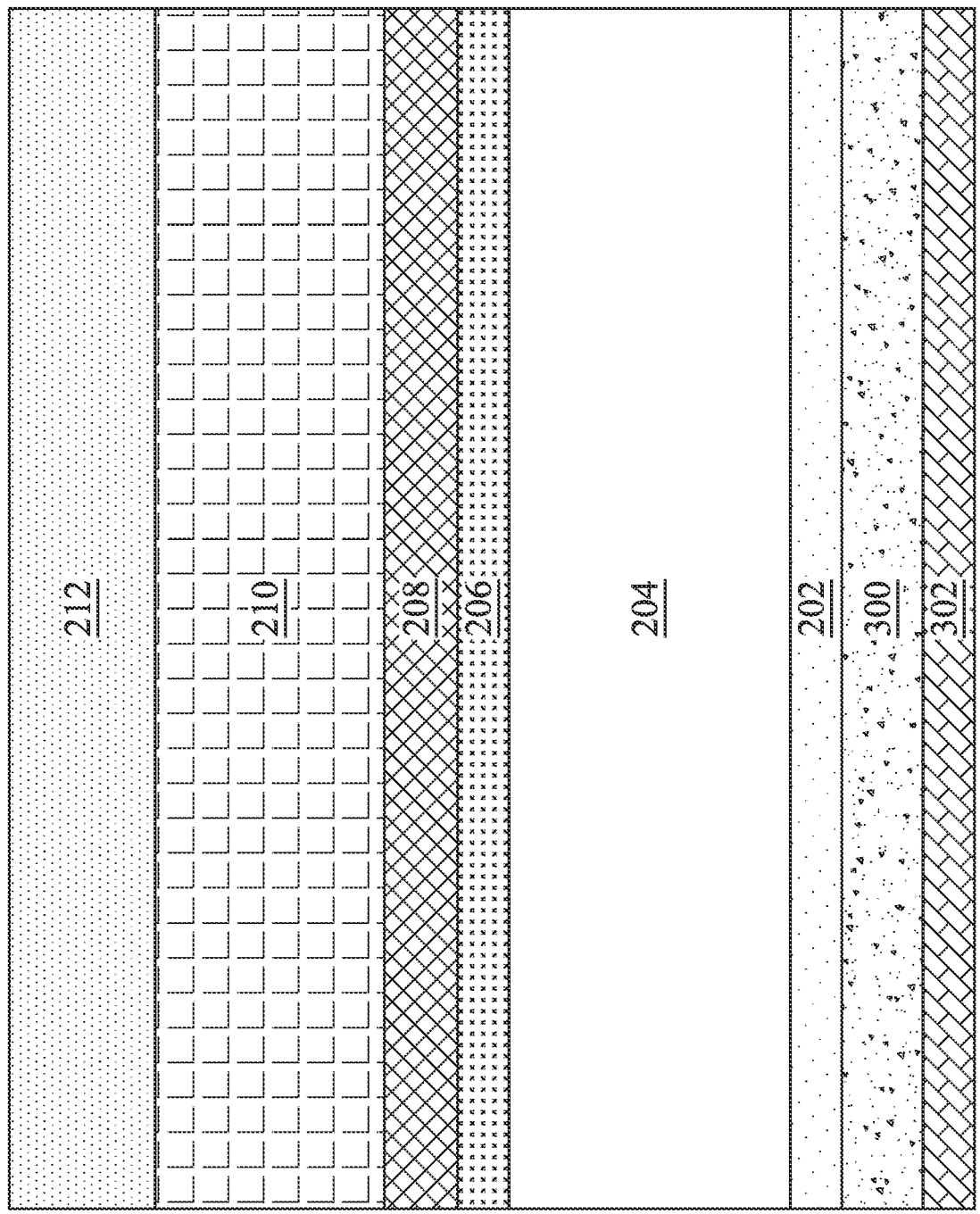

Referring to FIGS. 2 and 9, the method 150 proceeds to step 112 in which a patternable layer (e.g., a photoresist (PR) layer) 212 is deposited. In some embodiments, the photoresist layer is deposited by physical vapor deposition (PVD), chemical vapor deposition (CVD), plasma enhanced CVD (PECVD), low pressure CVD (LPCVD), atomic layer deposition (ALD) or other well-known deposition techniques. In some embodiments, the photoresist layer is deposited using a spin-on technique.

Referring again to FIG. 2, alternately the method 150 begins at step 114 in which the stack made by the previously mentioned steps 100-112 is secured. The stack may be secured at various points. For example, the stack may be secured with a conductive film layer 204 already deposited. For example, the stack may be secured with a conductive film layer 202, conductive film layer 204, and ESL 206 already present. For example, the stack may be secured with a conductive film layer 202, conductive film layer 204, ESL 206, and hardmask layer 208 already present.

Figure 10:
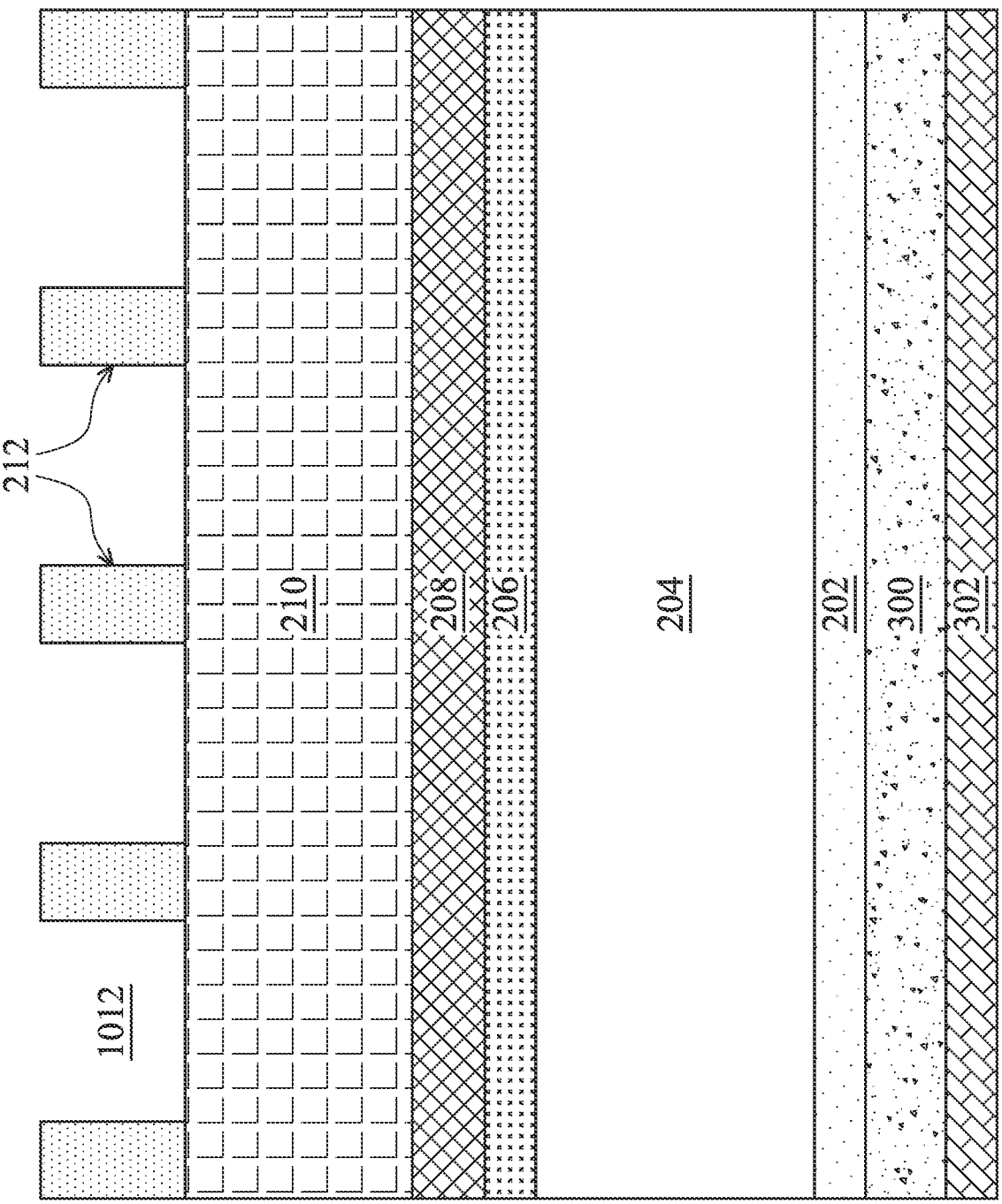

Referring to FIGS. 2 and 10, the method 150 proceeds to step 116 in which lithography may be performed. A resist mask (not shown) may be used for patterning and etching a pattern that defines respective desired positions of metal patterns 1220. Consequently, the patternable layer 212 can have one or more patterns (windows or openings) 1012 as shown in FIG. 10.

Figure 11:
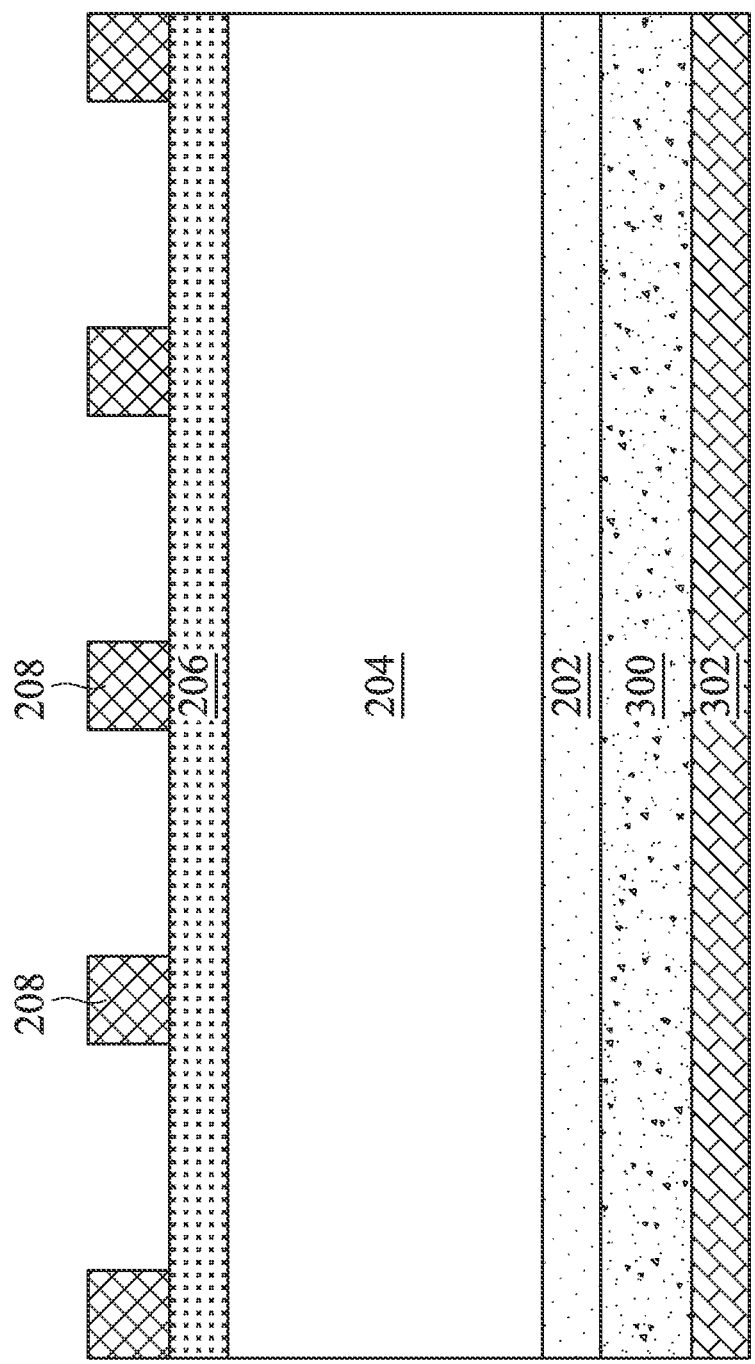

Referring to FIGS. 2 and 11, the method 150 proceeds to step 118 in which portions of the hardmask layer 208 may be removed, according to the patterns 1012 of the patternable layer 212 (FIG. 10). The portions of the hardmask layer 208 may be removed by performing an anisotropic etching process, and the etching process may be endpointed at the ESL 206. As such, the hardmask layer 208 can have one or more patterns 1020. An example of the anisotropic etching may include reactive ion etching (ME). Another example of the anisotropic etching may include inductively coupled plasma (ICP) or capacitively coupled plasma (CCP). Etch gasses may be selected from the group consisting of $CH_4$, $CH_3F$, $CH_2F_2$, $CHF_3$, $C_4F_8$, $C_4F_6$, $CF_4$, $H_2$, HBr, CO, $CO_2$, $O_2$, $BCl_3$, $Cl_2$, $N_2$, He, Ne, and Ar, among others known in the art. Etching may occur at pressures equal to or between about 0.2 milliTorr (mT) and about 120 mT. Etching may occur at temperatures between about 0° C. and about 100° C. Reactive Ion Etching may occur at powers at or between about 50 watts (W) and about 3000 W. Reactive Ion Etching may occur at bias at or between about 0 volts (V) and about 1200 V.

Figure 12:
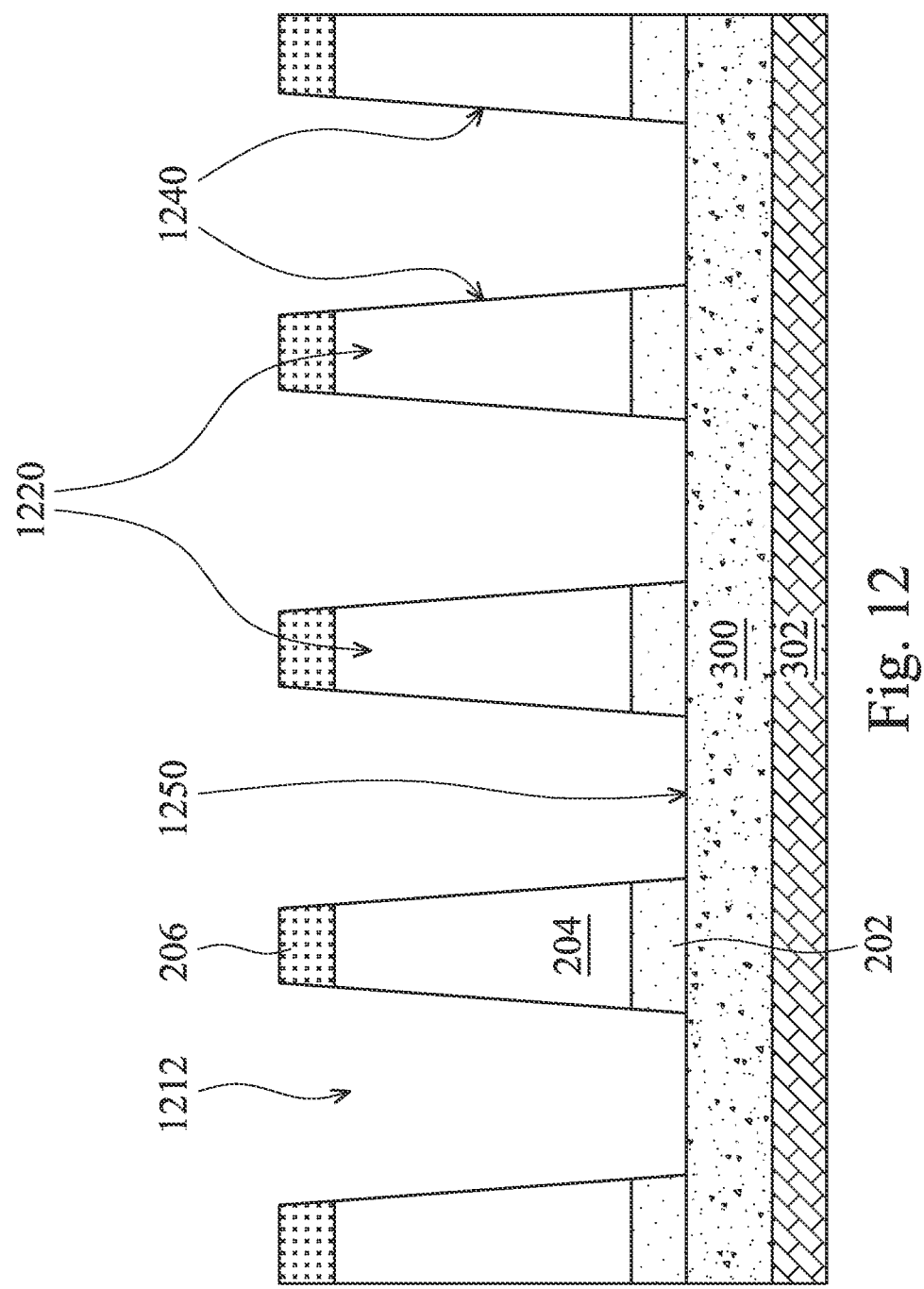

Referring to FIGS. 2 and 12, the method 150 proceeds to step 120 where portions of the ESL 206, the conductive film 202, and the conductive film 204 may be removed to form one or more recesses 1212, according to the patterns 1012 of the hardmask layer 208 (FIG. 11). Removal of the portions of the etch stop layer 206, the conductive film 202, and the conductive film 204 may include performing an ion beam etch. The etch gas may may be selected from the group consisting of He, Ne, Ar, Kr, and Xe. The ion beam etch incidence angle may be between about 0 degrees (d) and about 70 d. The ion beam etch power may between about 50 volts (V) and about 3000 V. The conductive film may be removed to form a recess 1212 between two metal patterns of the conductive film 202/204 stack. The top of the recess 1212 may be laterally wider than the bottom 1250 of the recess 1212. Accordingly, the profile angle of the recess 1212 may be between 50 degrees (d) and 90 d off of the horizontal plane of the bottom 1250 of the recess 1212.

The first conductive layer 202 and second conductive layer 204 removal can be by reactive ion etch. Examples of etchers that can be used include Reactive Ion Etching (ME), Inductively Coupled Plasma (ICP) or Capacitively Coupled Plasma (CCP) etcher. Example etch gases that can be used include $CH_3OH$, $C_2H_5OH$, $CH_4$, $CH_3F$, $CH_2F_2$, $CHF_3$, $C_4F_8$, $C_4F_6$, $CF_4$, $H_2$, HBr, CO, $CO_2$, $O_2$, $BCl_3$, $Cl_2$, $N_2$, He, Ne, and Ar, among others known in the art. Etching may occur at pressures equal to or between about 0.5 milliTorr (mT) and about 100 mT. Etching may occur at pressures equal to or between about 10 mT and about 50 mT. Etching may occur at temperature between about 15° C. and about 120° C. Reactive ion etching may occur at powers at or between about 150 watts (W) and about 3000 W. Reactive ion etching may occur at a bias at or between about 0 volts (V) and about 2000 V.

Figure 13:
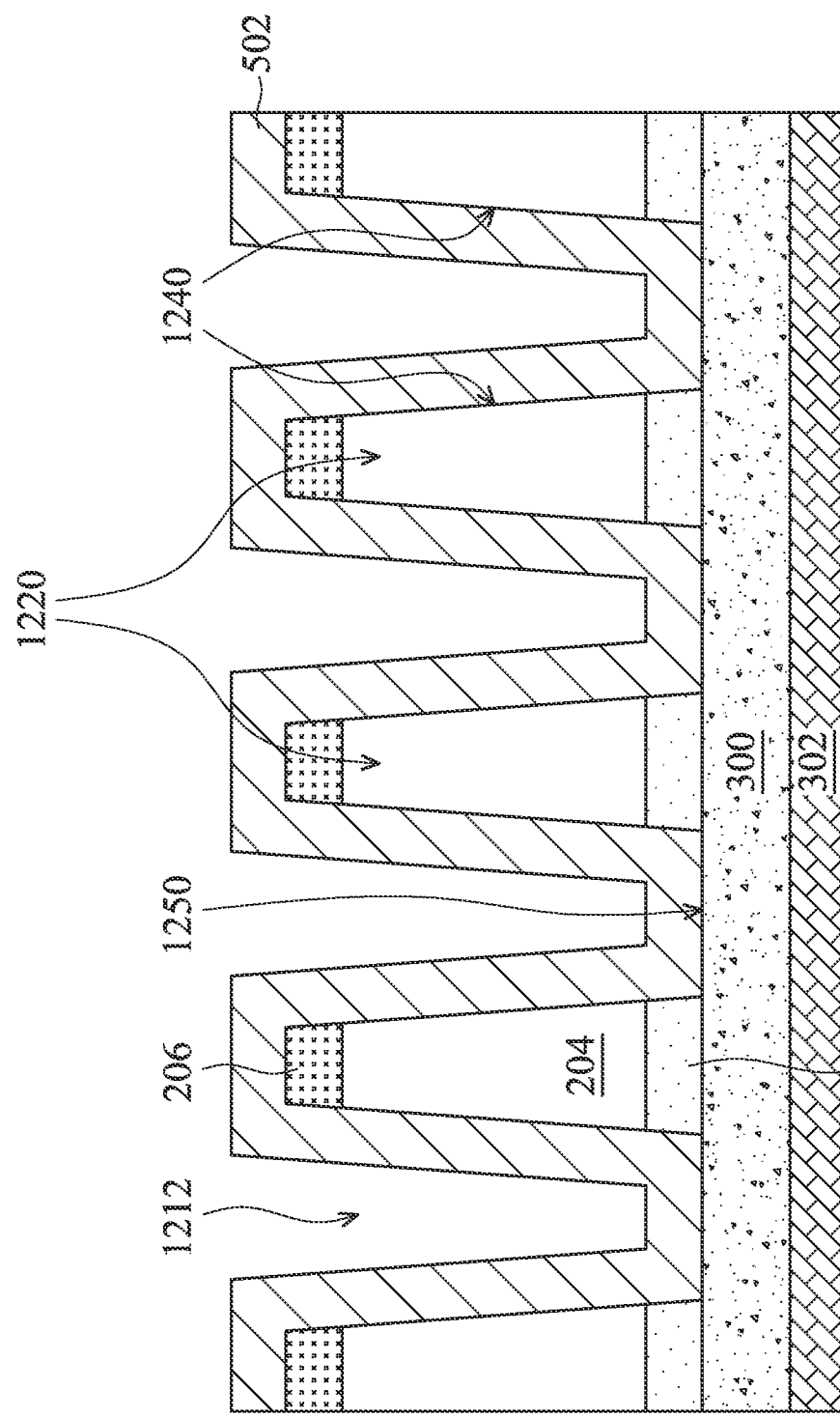

Referring to FIGS. 2 and 13, the method 150 proceeds to step 122 where a spacer 502 is deposited. The spacer 502 may be a conformal layer such that the spacer 502 can line the recesses 1212 (e.g., overlaying respective sidewalls 1240 and a bottom surface 1250 of each of the recesses 1212). In some embodiments, the spacer 502 may include a material selected from the group consisting of AlO, AlN, AlON, ZrO, TiO, TiSiO, ZrTiO, HfO, $SiO_2$, SiOC, SiC, SiCN, SiOCN, SiN, WOx, WN, WC, and WCN. In some embodiments, the spacer may be between about 10 angstroms and about 1000 angstroms. In some embodiments, the thickness of the spacer 502 may be between about 5 nanometers (nm) and about 270 nm. The spacer 502 may be deposited by methods such as physical vapor deposition (PVD), chemical vapor deposition (CVD), atomic layer deposition (ALD), or spin on deposition. Deposition may occur at temperatures at or between about 25° C. and about 400° C. The spacer 502 may be deposited to a thickness at or between about 10 angstroms and about 1000 angstroms. In some embodiments, the thickness of the spacer can be at or between about 5 nm and about 270 nm.

Figure 14:
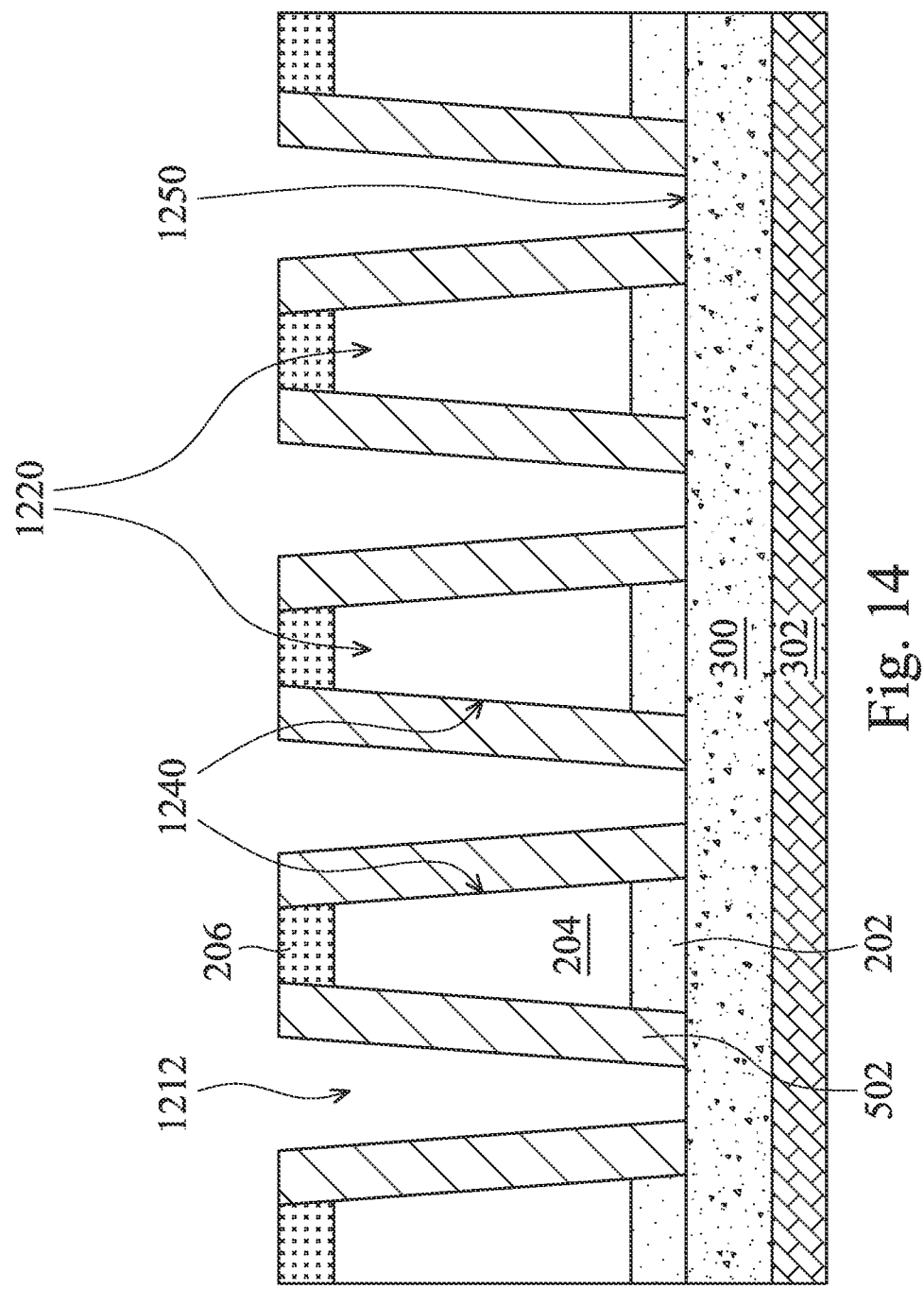

Referring to FIGS. 2 and 14 the method 150 proceeds to step 124 where portions of the spacer 502 in contact with the conductive film 204 may remain, while portions of the spacer 502 at the bottom surface 1250 of the recess 1212 and over a top surface of the remaining ESL 206 may be removed. For example, the spacer 502 may remain along the sidewalls 1240 of the recess 1212, as shown in FIG. 14. The resulting spacer 502 may be conformal along the height of the recess 1212. The resulting spacer may be thicker at the top of the recess 1212 than at the bottom 1250 of the recess 1212. The spacer may be angled along the side of the recess 1212. The profile angle of the spacer may be between 50 degrees (d) and 90 d off of the horizontal plane of the bottom 1250 of the recess 1212.

The resulting structure may be metal patterns with diminished line width roughness at a small critical dimension. The metal patterns of conductive film 202 and conductive film 204 may be separated by the dielectric spacer 502 from later deposited conductive film 702. Later deposited conductive film 702 may be deposited in the recess 1212. In some embodiments, the spacer at the bottom 1250 of the recess 1212 may be removed for formation of via under the conductive film 702.

Removal of portions of the spacers 502 may be by means of a reactive ion etcher. The etch gas used may be selected from the group consisting of $CH_4$, $CH_3F$, $CH_2F_2$, $CHF_3$, $C_4F_8$, $C_4F_6$, $CF_4$, $H_2$, HBr, CO, $CO_2$, $O_2$, $BCl_3$, $Cl_2$, $N_2$, He, Ne, and Ar. The gas pressure may be at or between about 0 mTorr (mT) to about 120 mT. The temperature may be at or between about 0° C. and about 100° C. The power may be at or between about 50 watt (W) and about 3000 W. The bias may be at or between about 0 volts (V) and 1200 V.

Figure 15:
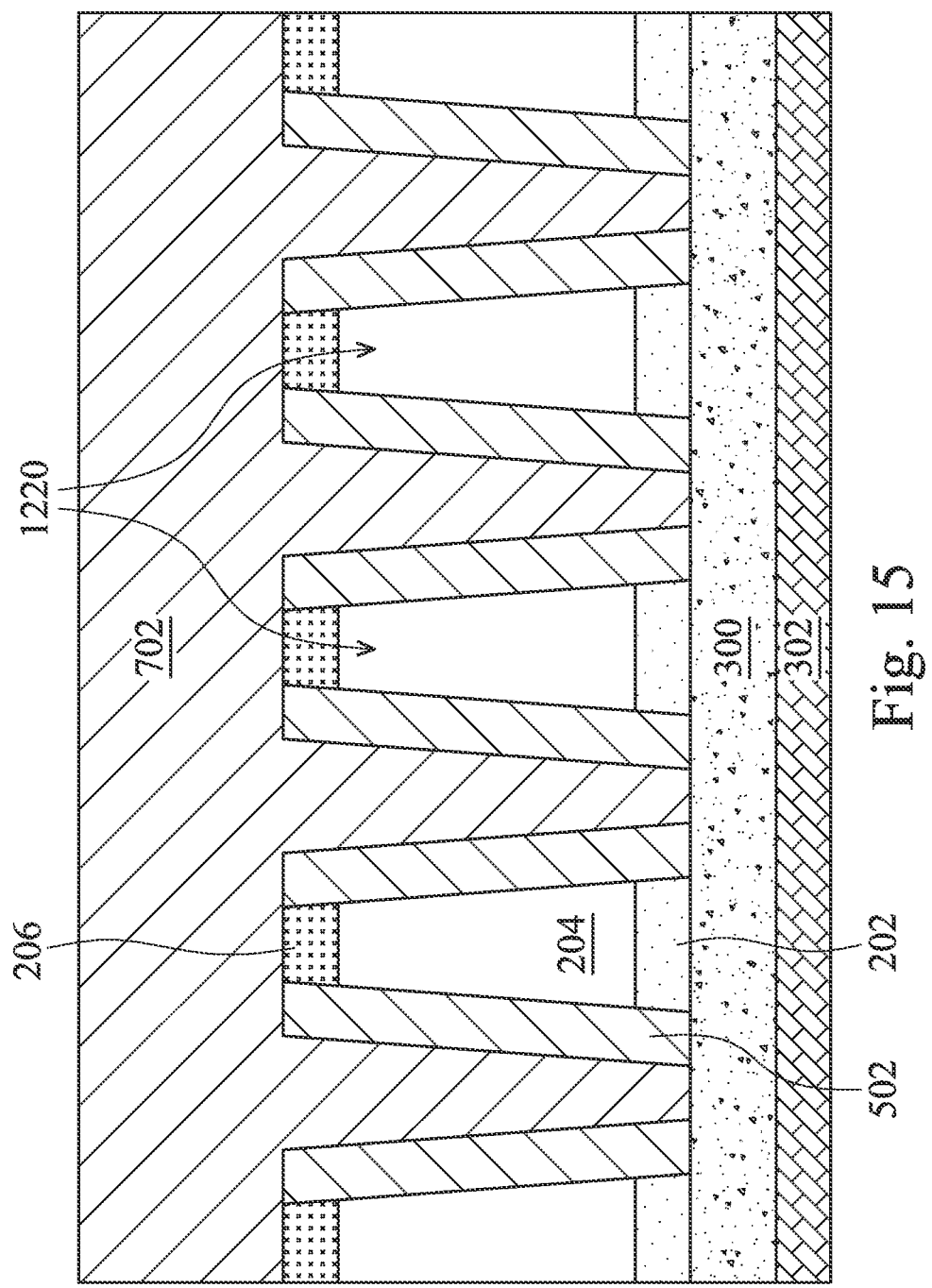

Referring to FIGS. 2 and 15, the method 150 proceeds to step 126 where a conductive material layer 702 is deposited. The conductive material 702 may be a metal layer. The conductive material 702 may include a material selected from the group consisting of tantalum (Ta), tantalum nitride (TaN), titanium (Ti), titanium nitride (TiN), aluminum (Al), copper (Cu), cobalt (Co), ruthenium (Ru), molybdenum (Mo), and tungsten (W). The thickness of the conductive layer 702 may be between about 10 angstroms and 1000 angstroms. The thickness of the conductive layer 702 may be between about 5 nanometers (nm) and about 300 nm.

In some embodiments, the conductive material 702 is deposited by an electro-chemical plating (ECP) process, physical vapor deposition (PVD), chemical vapor deposition (CVD), plasma enhanced CVD (PECVD), low pressure CVD (LPCVD), atomic layer deposition (ALD) or other well-known deposition techniques. In some embodiments, deposition may occur until the thickness of the layer is at or between about 10 angstroms and about 1000 angstroms.

Figure 16:
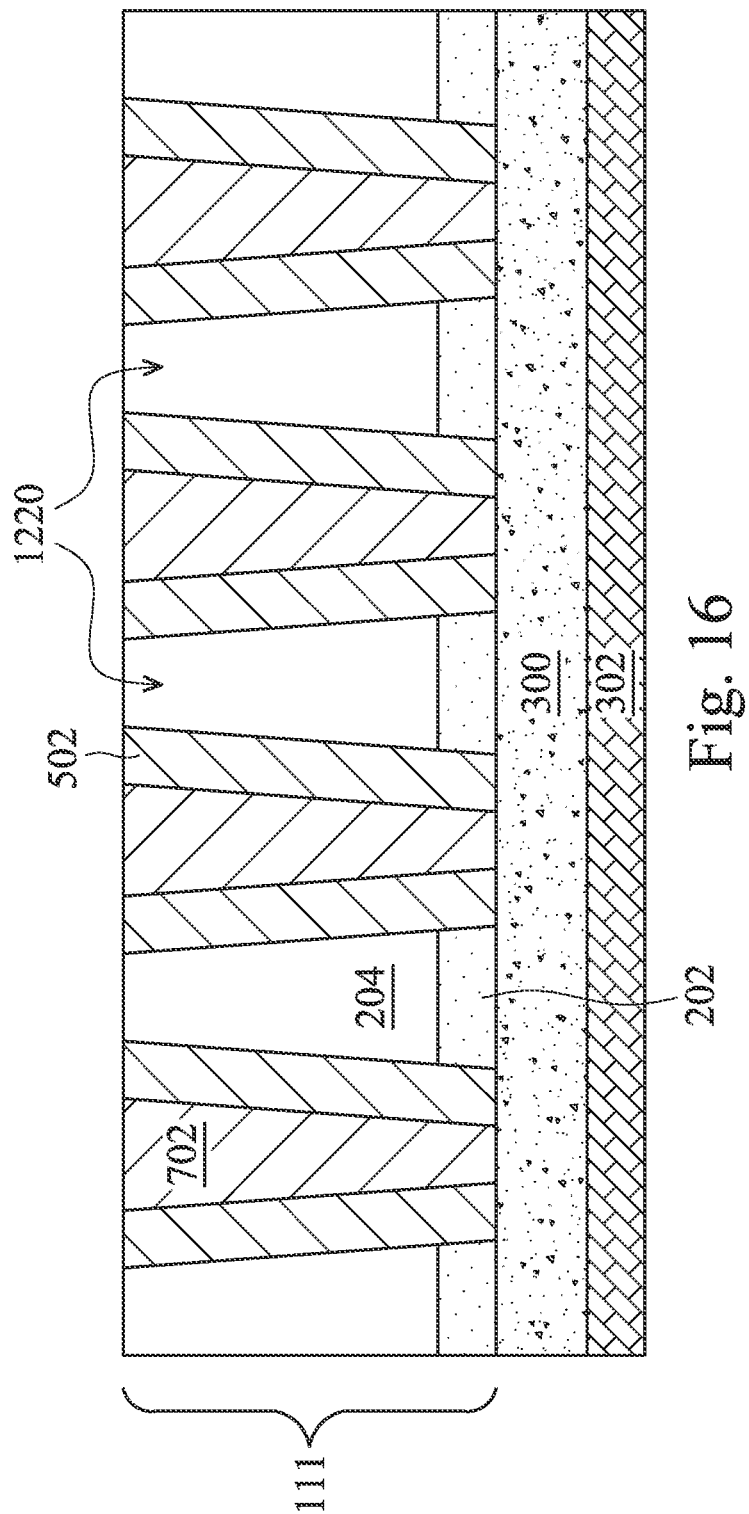

Referring to FIGS. 2 and 16 the method 150 proceeds to step 128 where the surface of the substrate is flattened. In some embodiments, the surface is flattened when a portion of the conductive material is removed. In some embodiments, the removal process is a chemical mechanical polishing (CMP) process.

Figure 17:
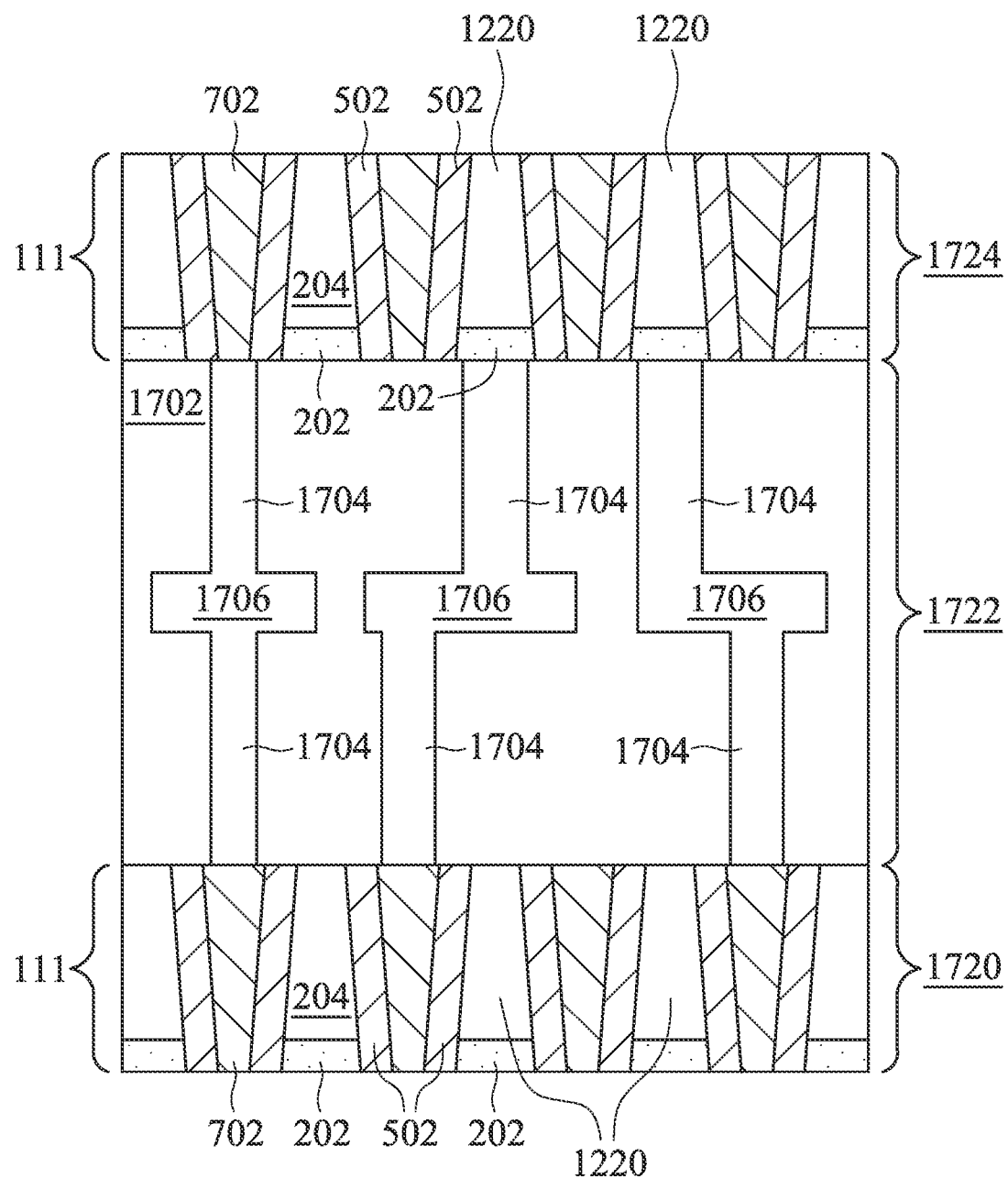
FIG. 17 illustrates cross-sectional views of an example of a multilayer semiconductor where at least one of the layers is made by the method of FIG. 2, in accordance with some embodiments.

Referring to FIGS. 2 and 17, the method 150 may be used to form any metal layer in a multilayer metal interconnect such as that represented by FIG. 17. The method 150 may be used to form a single metal layer, or may be used to form multiple metal layers. It is noted that the method 150 may be iteratively performed to form one or more subsequent metal interconnect levels of the semiconductor device. This method 150 may be repeated until the desired number of layers of metal interconnects are formed. Additionally, method 150 may be used to form one layer of a multilayer device while other layers are formed using a dual damascene technique or other technique known in the art. FIG. 17, for instance, shows a first metal layer 1720 and a third metal layer 1724 formed using by method 150 and a second metal layer 1722 formed using a dual damascene technique connected by vias 1704. Those skilled in the art will recognize that each layer may be formed by method 150 or an alternate technique and the number of layers and method of formation may be selected based on the desired chip architecture.

Disclosed herein is a novel interconnect structure. The interconnect structure may have a first conductive feature. The first conductive feature may have a first conductive layer 204. The conductive layer 204 may be a metal layer 204. The first conductive feature may have a second conductive layer 202. The conductive layer 202 may be a metal layer 202. The first conductive feature may be separated from the second conductive feature 702 by a spacer 502 wherein one of the first conductive feature and the second conductive feature 702 is electrically connected by a conductive via 1704 through a dielectric layer 1702 to a third conductive feature 1706.

The first conductive layer 204 may include a material selected from the group consisting of Ta, TaN, TiN, Al, Cu, Co, Ru, Mo, and W. The thickness of the first conductive layer 204 may be between about 10 angstroms and about 1000 angstroms. The thickness of the first conductive layer 204 may be between about 5 nanometers (nm) and about 300 nm. The second conductive layer 202 may include a material selected from the group consisting of Ta, TaN, TiN, Al, Cu, Co, Ru, Mo, or W. The thickness of the second conductive layer 202 may be between about 10 angstroms and 1000 angstroms. The thickness of the second conductive layer 202 may be between 5 nm and 300 nm. The second conductive feature 702 may be Ta, TaN, TiN, Al, Cu, Co, Ru, Mo, or W. The thickness of the second conductive feature 702 may be between 10 angstroms and 1000 angstroms. The thickness of the second conductive feature 702 may be between 5 nm and 300 nm.

Disclosed herein is a method for forming an interconnect structure. The method may include directly etching a first conductive layer 204 to form a plurality of first metal patterns. The plurality of metal patterns may be spaced apart from one another by one of a plurality of recesses 1212.

The method may include forming a dielectric spacer 502 extending along sidewalls 1240 of each of the plurality of recesses 1212. The dielectric spacer 502 may be less than about 10,000 angstroms in thickness. The dielectric spacer 502 may be less than about 1,000 angstroms in thickness. The dielectric spacer 502 may be less than about 100 angstroms in thickness. The dielectric spacer 502 may be formed by chemical vapor deposition. The dielectric spacer 502 may be formed by forming a dielectric layer along the sides and bottom 1250 of the plurality of recesses 1212. The dielectric spacer 502 may be formed by removing the dielectric layer from the bottom 1250 of the plurality of recesses 1212. The dielectric spacer 502 may include a material selected from the group consisting of ZrO, TiO, TiSiO, ZrTiO, HfO, $SiO_2$, SiOC, SiC, SiCN, SiOCN, SiN, WOx, WN, WC, and WCN. In some embodiments, the thickness of the spacer 502 may be between about 5 nanometers (nm) and about 270 nm The method may include filling the plurality of recesses 1212 with a conductive material to form a plurality of second metal patterns. The plurality of recesses 1212 may be filled with a conductive material by one or more methods selected from the group of chemical vapor deposition and physical vapor deposition.

The horizontal width of the first metal pattern may be greater than the horizontal width of the second metal pattern. The horizontal width of the first metal pattern may be twice the horizontal width of the second metal pattern. The horizontal width of the first metal pattern may be less than the horizontal width of the second metal pattern. The horizontal width of the first metal pattern may be one half the horizontal width of the second metal pattern. The horizontal width of the first metal pattern may be about the same as the horizontal width of the second metal pattern.

Disclosed herein is a method that may include directly etching a first conductive layer 204 to form a first metal pattern and a second metal pattern. The first metal pattern and the second metal pattern may be along a first horizontal layer. The method may include forming a dielectric spacer 502 between the first metal pattern and the second metal pattern. The method may include forming a via 1704 connecting the first metal pattern to a third metal pattern. The third metal pattern may be along a second horizontal layer. The first horizontal layer and the second horizontal layer may be separated by third horizontal layer consisting of a dielectric layer.

Disclosed herein is a method for forming an interconnect structure. The method may include depositing a first conductive film 204 over a dielectric layer 300. The method may include depositing a hardmask layer 208 over the conductive film 204. The method may include removing portions of the hardmask layer 208 and conductive film 204.

The method may include depositing a conductive film 202 over the dielectric layer 300 and below a conductive film 204. The method may include depositing a hardmask layer 208 directly above the ESL 206. The ESL 206 may include a material selected from the group consisting of Ta, TaN, TiN, ZrO, Ti, TiSiO, ZrTiO, HfO, SiC, SiOC, SiN, SiCN, SiON, SiOCN, WOx, WN, WC, WCN, and W. The thickness of the ESL 206 may be between about 10 angstroms and about 1000 angstroms. The hardmask layer 208 may be Ta, TaN, TiN, ZrO, Ti, TiSiO, ZrTiO, HfO, SiC, SiOC, SiN, SiCN, SiON, SiOCN, WOx, WN, WC, WCN, or W. The thickness of the hardmask layer 208 may be between about 10 angstroms and about 1000 angstroms.

The method may include removal of portions of the conductive film 204.

Removal of portions of the conductive film 204 may be by means of an ion beam etch. The etch gas may be He, Ne, Ar, Kr or Xe. The ion beam etch angle may be between 0 about degrees (d) and about 70 d. The ion beam etch power may between about 50 volts (V) and 3000 V. Removal of portions of the conductive film may form a recess 1212.

The method may include depositing spacers 502 extending along a first sidewall and a second sidewall of the conductive film 204. The method may include depositing a second conductive film 702 between the spacers 502. The method may include forming a via 1704 through the dielectric layer 1702. The via 1704 may be connected to the first conductive film 204. The via 1704 may be connected to the second conductive film 702.

The method may include removing the portion of the spacers 502 at the bottom 1250 of the recess. Removal of the portions of the spacers 502 may be by means of a reactive ion etcher. The etch gas may be selected from the group consisting of $CH_4$, $CH_3F$, $CH_2F_2$, $CHF_3$, $C_4F_6$, $CF_4$, $H_2$, HBr, CO, $CO_2$, $O_2$, $BCl_3$, $Cl_2$, $N_2$, He, Ne, and Ar. The gas pressure may be between about 0 milliTorr (mT) and about 120 mT. The temperature may be between about 0° C. and about 100° C. The power may be between about 50 watt (W) and about 3000 W. The bias may be between about 0 volt (V) and about 1200 V.

Disclosed herein is a novel semiconductor device 111. The device may include a substrate containing a third conductive feature. The device may include a dielectric stack 1702 over the substrate. The device may include a first conductive feature 204 and a second conductive feature 702. The first conductive feature 204 and second conductive feature 702 may be on the same lateral plane with each other. The first conductive feature 204 and second conductive feature 702 may be separated from one another by a spacer 502. The first conductive feature 204, second conductive feature 702 and spacer 502 may be over the dielectric stack 1702. The first conductive feature 204 may be connected by a conductive via 1704 to a third conductive feature. The second conductive feature 702 may connected by a conductive via 1704 to a third conductive feature. The spacer 502 may include a material selected from the group consisting of AlO, AN, AlON, ZrO, TiO, TiSiO, ZrTiO, HfO, $SiO_2$, SiOC, SiC, SiCN, SiOCN, SiN, WOx, WN, WC, and WCN. The thickness of the spacer 502 may be between about 5 nanometers (nm) and 270 nm.

The methods and structures disclosed show various embodiments of a semiconductor device 111. It is noted that the method of FIG. 2 does not produce a completed semiconductor device 111. A completed semiconductor device 111 may be fabricated using complementary metal-oxide-semiconductor (CMOS) technology processing. Accordingly, it is understood that additional processes may be provided before, during, and after the methods 100 through 116 of FIG. 2, and that some other processes may only be briefly described herein. Also, FIGS. 1 and 3 through 16 are simplified for a better understanding of the present disclosure. For example, although the figures illustrate the semiconductor device 111, it is understood the IC may comprise a number of other devices comprising transistors, resistors, capacitors, inductors, fuses, etc.

In one aspect of the present disclosure, the disclosed method may include directly etching a first metal layer to form a plurality of first metal patterns. The plurality of first metal patterns may be spaced apart from one another by one of a plurality of recesses. The method may include forming a dielectric spacer extending along the sidewalls 1240 of each of the plurality of recesses. The method may include filling the plurality of recesses with a conductive material to form a plurality of second metal patterns.

In another aspect of the present disclosure, the method may include directly etching a first metal layer to form a first metal pattern and a second metal pattern in a first horizontal layer that are laterally separated from each other. The method may include forming dielectric spacers extending along respective sidewalls of the first metal pattern and the second metal pattern. The respective sidewall of the first metal pattern and the second metal pattern may face each other. The method may include forming a third metal pattern sandwiched between the dielectric spacers. The third metal pattern may be in the first horizontal layer.

In yet another aspect of the present disclosure, the method may include forming an interconnect structure. The method may include depositing a first conductive film over a first dielectric layer. The method may include depositing a first hard mask layer over the first conductive film. The method may include removing portions of the first hard mask layer and first conductive film to form a plurality of first metal patterns. The method may include forming a plurality of spacers. The spacers may extend along a sidewall of one of the first metal patterns. The method may include depositing a second conductive film between the spacers to form a plurality of second metal patterns.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    etching a first metal layer to form a plurality of first metal patterns, the plurality of first metal patterns spaced apart from one another by one of a plurality of recesses;
    forming a dielectric spacer extending along sidewalls of each of the plurality of recesses; and
    filling the plurality of recesses with a conductive material to form a plurality of second metal patterns.

2. The method of claim 1, wherein the first metal layer is etched using an ion beam etcher.

3. The method of claim 2, wherein the ion beam etcher utilizes an etch gas is selected from the group consisting of He, Ne, Ar, Kr, Xe, or a combination thereof.

4. The method of claim 1, wherein the dielectric spacer is less than about 100 angstroms in thickness.

5. The method of claim 1, wherein forming the dielectric spacer further comprises:
    forming a dielectric layer along the sidewalls and a bottom surface of each of the plurality of recesses; and
    removing the dielectric layer from the bottom surface of each of the plurality of recesses.

6. The method of claim 1, wherein the dielectric spacer is selected from the group consisting of AlO, AlN, AlON, ZrO, TiO, TiSiO, ZrTiO, HfO, $SiO_2$, SiOC, SiC, SiCN, SiOCN, SiN, WOx, WN, WC, and WCN or a combination thereof.

7. The method of claim 1, wherein filling the plurality of recesses with the conductive material further comprises depositing the conductive material using a technique selected from the group consisting of chemical vapor deposition and physical vapor deposition.

8. The method of claim 1, wherein a horizontal width of each of the plurality of second metal patterns is two to four times a horizontal width of each of the plurality of first metal patterns.

9. The method of claim 1, wherein a horizontal width of the dielectric spacer at an upper portion of the corresponding recess is smaller than a horizontal width of the dielectric spacer at a lower portion of the corresponding recess.

10. A method, comprising:
    etching a first metal layer to form a first metal pattern and a second metal pattern that are laterally separated from each other wherein the first metal pattern and the second metal pattern are on a horizontal plane;
    forming dielectric spacers extending along respective sidewalls of the first metal pattern and the second metal pattern, the sidewalls facing to each other; and
    forming, in a first horizontal layer, a third metal pattern sandwiched between the dielectric spacers.

11. The method of claim 10, further comprising forming a via connecting the first metal pattern to a fourth conductive region, wherein the fourth conductive region is along a second horizontal layer and the first horizontal layer and the second horizontal layer are separated by third horizontal layer consisting of a dielectric layer.

12. A method of forming an interconnect structure, comprising:
    depositing a first conductive film over a first dielectric layer;
    depositing a first hard mask layer over the first conductive film;
    removing portions of the first hard mask layer and the first conductive film to form a plurality of first metal patterns;
    forming a plurality of spacers, each of the plurality of spacers extending along a sidewall of a respective one of the plurality of first metal patterns;
    depositing a second conductive film between the plurality of spacers to form a plurality of second metal patterns; and
    forming a conductive via through a second dielectric layer over the first dielectric layer;
    wherein the conductive via is electrically coupled to one of the first plurality of first metal patterns and one of the second plurality of metal patterns.

13. The method of claim 12, further comprising depositing a third conductive film over the first dielectric layer and below the first conductive film.

14. The method of claim 12, further comprising depositing a second hardmask layer directly above the first hardmask layer.

15. The method of claim 14, wherein the first hardmask layer and second hardmask layer are selected from the group consisting of Ta, TaN, TiN, ZrO, Ti, TiSiO, ZrTiO, HfO, SiC, SiOC, SiN, SiCN, SiON, SiOCN, WOx, WN, WC, WCN, and W or a combination thereof, and the thickness of the first hardmask layer and the second hardmask layer is between 10 angstroms and 1000 angstroms.

16. The method of claim 12, wherein removing portions of the first hard mask layer and the first conductive film is through a reactive ion etcher.

17. The method of claim 16, wherein the reactive ion etcher utilizes an etch gas that includes a chemical selected from the group consisting of $CH_4$, $CH_3F$, $CH_2F_2$, $CHF_3$, $C_4F_8$, $C_4F_6$, $CF_4$, $H_2$, HBr, CO, $CO_2$, $O_2$, $BCl_3$, $Cl_2$, $N_2$, He, Ne, Ar, or a combination thereof.

18. The method of claim 17, wherein the etch gas has a gas pressure that is between about 0 millitorr and about 120 milliTorr, the etch gas has a temperature that is between about 0° C. and about 100° C., the power of the reactive ion etcher is between about 50 watts and about 3000 watts, and the bias of the reactive ion etcher is between about 0 volt and 1200 volts.

19. The method of claim 11, wherein removing portions of the first hard mask layer and the first conductive film is through an ion beam etcher.

20. The method of claim 19, wherein the ion beam etcher utilizes an etch gas that is selected from the group consisting of He, Ne, Ar, Kr, and Xe.

* * * * *